United States Patent
Yu et al.

(10) Patent No.: US 7,851,383 B2
(45) Date of Patent: Dec. 14, 2010

(54) METHOD AND SYSTEM FOR FORMING A CONTROLLABLE GATE OXIDE

(75) Inventors: Xiaopeng Yu, Shanghai (CN); Sean F. Zhang, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 197 days.

(21) Appl. No.: 12/052,640

(22) Filed: Mar. 20, 2008

(65) Prior Publication Data

US 2008/0233692 A1    Sep. 25, 2008

(30) Foreign Application Priority Data

Mar. 22, 2007    (CN) .................... 2007 1 0038449

(51) Int. Cl.
*H01L 21/31* (2006.01)
(52) U.S. Cl. .................. 438/773; 438/770; 438/775; 438/431
(58) Field of Classification Search ......... 438/770–775, 438/635, 766, 410, 431, 165
See application file for complete search history.

(56) References Cited

U.S. PATENT DOCUMENTS

| | | | |
|---|---|---|---|
| 2007/0122981 A1* | 5/2007 | Park | 438/275 |
| 2007/0218606 A1* | 9/2007 | Ozawa et al. | 438/165 |
| 2008/0121932 A1* | 5/2008 | Ranade | 257/192 |

FOREIGN PATENT DOCUMENTS

| | | |
|---|---|---|
| CN | 1214540 A | 4/1999 |
| CN | 1400634 A | 3/2003 |
| CN | 1459829 A | 12/2003 |
| CN | 1770402 A | 5/2006 |

\* cited by examiner

*Primary Examiner*—Dung A. Le
(74) *Attorney, Agent, or Firm*—Townsend and Townsend and Crew LLP

(57) ABSTRACT

Method and system for forming gate structure with controllable oxide. The method includes a step for providing a semiconductor substrate and defining a source region and a drain region within the semiconductor substrate. Furthermore, the method includes a step for defining a gate region positioned between the source region and the drain region. Moreover, the method provides a step for forming a first layer overlaying the gate region. The first layer includes silicon nitride and/or silicon oxynitride material. Also, the method includes a step for forming a second layer by subjecting the semiconductor substrate to at least oxygen at a predetermined temperature range for a period of time. The second layer has a thickness less than 20 Angstroms.

18 Claims, 4 Drawing Sheets

METHOD AND SYSTEM FOR FORMING A CONTROLLABLE GATE OXIDE

CROSS-REFERENCES TO RELATED APPLICATIONS

This application claims priority to Chinese Patent Application No. 200710038449.70, filed Mar. 22, 2007, commonly assigned and hereby incorporated by reference for all purposes.

BACKGROUND OF THE INVENTION

The present invention is directed to integrated circuits and their processing for the manufacture of semiconductor devices. More particularly, the invention provides a method and a device for an oxidation process for the manufacture of integrated circuits. Merely by way of example, the invention has been applied to techniques related to forming gate dielectric of transistor. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

One of the fabrication processes of ICs is oxidation, which forms insulating layers. For example, silicon oxide grows on a silicon wafer to form dielectrics by exposing the silicon wafer to $O_2$ at high temperatures, between 700 and 1100° C. in a furnace. It may use either water vapor (steam) or molecular oxygen as the oxidant; it is consequently called either wet or dry oxidation. During a thermal oxidation process, silicon atoms on the clean Si wafer surface react with either molecular oxygen or water vapor to form $SiO_2$. Thermal oxide incorporates silicon from the substrate and combines with oxygen supplied from the ambient. Thus, it grows both down into the wafer and extends out of the silicon surface. For every unit thickness of silicon consumed, 2.17 unit thicknesses of silicon oxide will be formed. If a bare silicon surface is oxidized, 46% of the oxide thickness will lie below the original surface, and 54% above it.

Wet oxidation process provides a faster growth rate for silicon oxide than a dry oxidation for growing a thick thermal oxide. Typically, a dry oxidation process, though a wet oxidation process is not excluded, is used for producing high quality silicon oxide films with a thin or ultra-thin thickness. Over the past, dry oxidation techniques have been employed to form thin dielectric layer for a gate structure of a metal-oxide-semiconductor field-effect-transistor (MOSFET). For example, a layer of $SiO_2$ is formed as dielectric between the electrical contact and the underlying substrate.

FIG. 1 is a conventional MOSFET structure 100. MOSFET structure 100 includes a substrate 101. Within the substrate, a gate region 106 is positioned between a source region 103 and a drain region 102. A gate structure 105 overlies the gate region 106. Typically, gate structure 105 includes electrical conductive materials, such as polysilicon, silicide, etc. A gate dielectric layer 104 is formed between the gate structure 105 and the substrate.

In order to reduce sizes of integrated circuits, it is often necessary to reduce the thickness of dielectric layer 104. Over the past, various conventional techniques have been developed for forming gate dielectric. Unfortunately, conventional techniques are often inadequate.

Therefore, it is desired to have an improved method for forming gate structures, including the gate dielectric.

BRIEF SUMMARY OF THE INVENTION

The present invention is directed to integrated circuits and their processing for the manufacture of semiconductor devices. More particularly, the invention provides a method and device for the oxidation process for the manufacture of integrated circuits. Merely by way of example, the invention has been applied to techniques related to forming gate dielectric of transistor. But it would be recognized that the invention has a much broader range of applicability.

According to an embodiment, the present invention provides a method for manufacturing an integrated circuit. The method includes a step for providing a semiconductor substrate. The method also includes a step for defining a source region and a drain region within the semiconductor substrate. Furthermore, the method includes a step for defining a gate region within the semiconductor substrate. For example, the gate region is positioned between the source region and the drain region. Moreover, the method provides a step for forming a first layer overlaying the gate region. The first layer includes silicon nitride and/or silicon oxynitride material. Also, the method includes a step to form a second layer by oxidizing the semiconductor substrate overlaid with the first layer at a predetermined temperature range for a period of time. For example, the second layer includes at least silicon oxide material overlaying the gate region with a thickness less than 20 angstroms. The method further includes a step for forming a gate structure overlaying the second layer on the gate region.

In one embodiment, the oxidizing the semiconductor substrate overlaid with the first layer includes placing the semiconductor substrate in a furnace in a dry oxidation process. In another embodiment, the oxidizing the semiconductor substrate overlaid with the first layer includes subjecting the semiconductor substrate to a water vapor in a wet oxidation process.

According to another embodiment, the present invention provides a method of making controllable gate oxide for manufacture of an integrated circuit. The method includes providing a semiconductor substrate and defining a source region and a drain region within the semiconductor substrate. Additionally, the method includes defining a gate region within the semiconductor substrate. For example, the gate region is positioned between the source region and the drain region. Moreover, the method includes forming a first layer overlaying the gate region. For example, the first layer is formed by a first nitridation step, at which the semiconductor substrate was subjected to $N_2O$, NO, or $NH_3$ gas at a first predetermined temperature range and for a first period of time. In addition, the method includes a step forming a second layer by subjecting the semiconductor substrate overlaid with the first layer to at least oxygen at a predetermined temperature range of between 700 and 1100 degrees Celsius for a second period of time between one to sixty minutes. The second layer includes at least silicon oxide material overlaying the gate region and has a thickness less than 20 Angstrom. Furthermore, the method may includes a second nitridation step, at which the semiconductor substrate with the second layer overlying the gate region is subjected to $N_2O$, NO, or $NH_3$ gas. For example, a third layer is formed at the second nitridation step by incorporating nitrogen atoms into the second layer. Additionally, the method includes a step for forming a gate layer over the gate region. For example, the gate layer is formed overlying the third layer after the second nitridation step. In another example, the gate layer is formed overlying the second layer without the second nitridation step.

Many benefits are achieved by way of the present invention over conventional techniques. For example, the present technique provides an easy to use process that relies upon conventional technology. For example, conventional furnace is utilized for gate oxide formation according to embodiments of the present invention. Technique according to the present invention allows for controllable gate dielectric thickness not achievable by conventional techniques. In some embodiments, the method provides an improved technique for forming ultra thin gate dielectric layer for a gate structure for a MOSFET. For example, dielectric layers formed according to the present invention are typically thinner than dielectric layers formed according to conventional techniques. On the other hand, to get the same gate oxide thickness, oxidation temperature should be higher according to the present invention. A higher temperature thermal oxidation process is preferred for gate oxide quality and desirable electric properties. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the present method provides an oxidation process for the manufacture of integrated circuits. Merely by way of example, the invention has been applied to techniques related to forming gate dielectric for a transistor. But it would be recognized that the invention has a much broader range of applicability.

As explained above, various conventional techniques have been developed for forming gate dielectric layers for gate structures. In a conventional technique, a layer of silicon oxide material is formed over the gate region of a substrate through an oxidation process.

Typically, it is often desirable to use conventional and commercially available furnaces for various reasons, such as low cost and compatibility. Unfortunately, to achieve good electric properties, gate oxide should typically be grown at high temperatures, while oxidation rate becomes too fast to be well controlled at high temperature. As a result, conventional furnaces are often incapable for providing ultra thin gate dielectric. Meanwhile, several new techniques, e.g. in-situ steam generation (ISSG), high-K gate dielectric deposition, have been developed for gate dielectric formation. Although these techniques enable an ultra thin gate dielectric with ultra low equivalent oxide thickness (EOT), they require the use of new machinery, which are often prohibitively expensive for various purposes.

Therefore, it is to be appreciated that various embodiments of the present invention provide a method and system for forming thin gate oxide by using currently prevailing furnace system, thereby providing huge cost-reductions.

Figure 1:
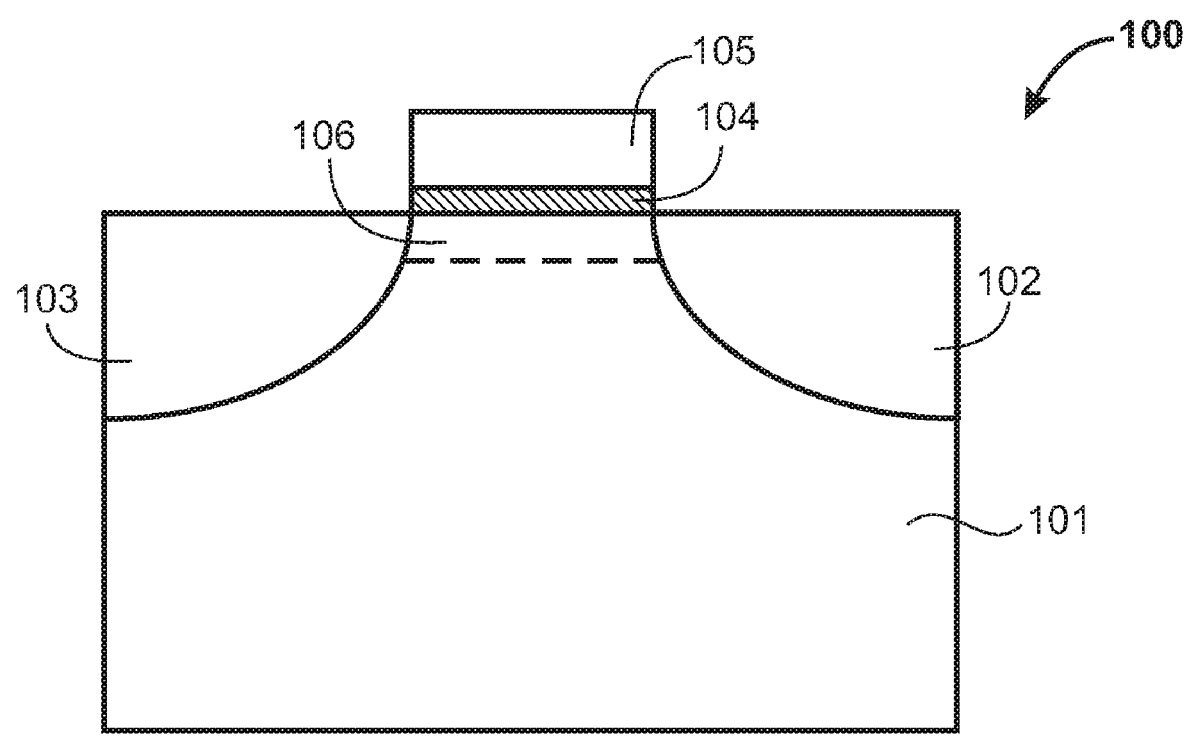
FIG. 1 is a conventional MOSFET structure. A MOSFET 100 includes a substrate 101.
Figure 2:
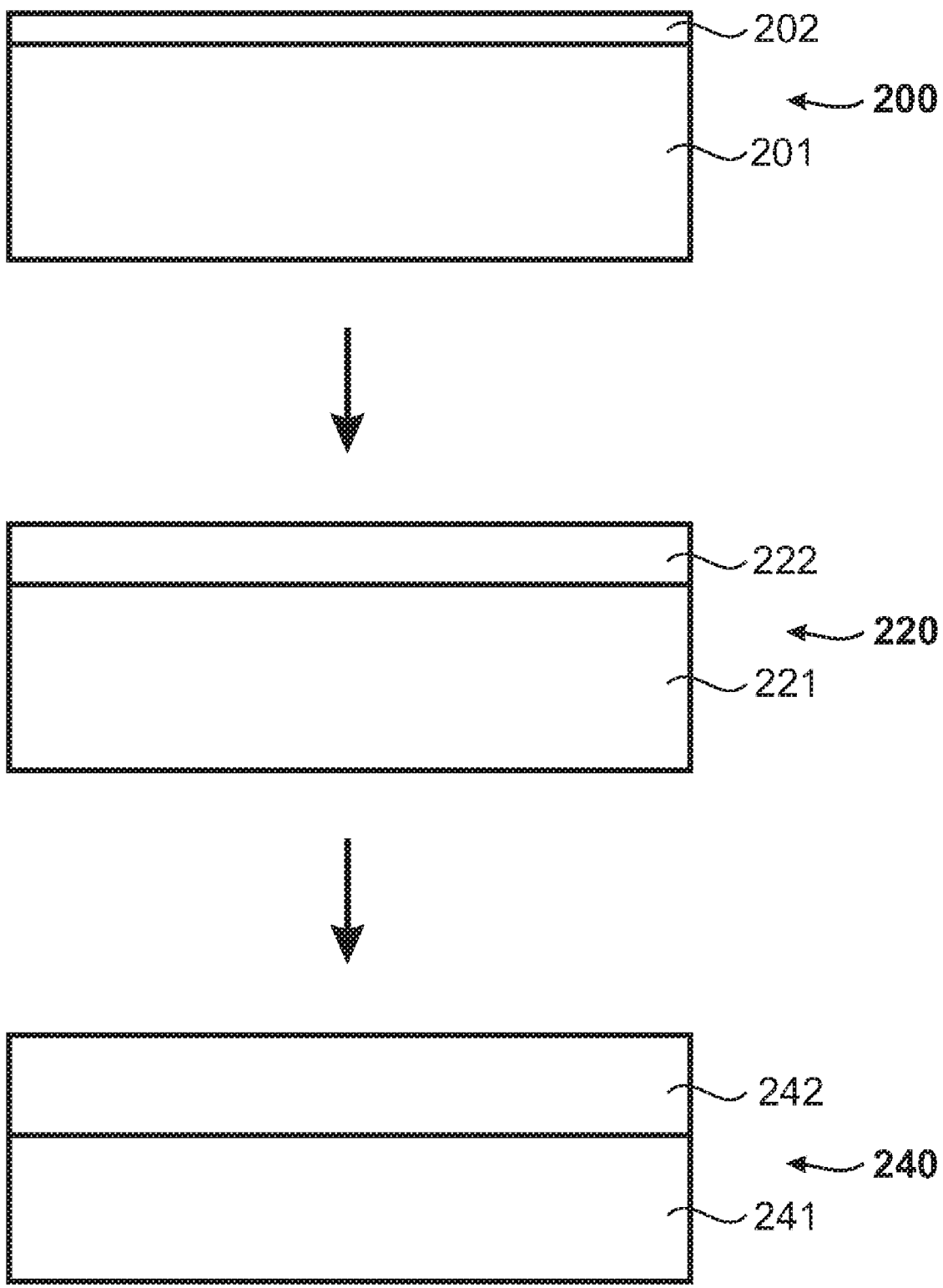
FIG. 2 is a simplified diagram illustrating a conventional technique for forming a dielectric layer for a gate structure of a MOSFET.

FIG. 2 is a simplified diagram illustrating a conventional technique for forming a dielectric layer for a gate structure of a MOSFET. In a partially processed integrated circuit 200, typically a pre-clean step is performed before a substrate material 201 is sent for oxidation. After the pre-clean step, a thin silicon oxide layer 202, which is called "native oxide", is always formed on the substrate material 201 when it is exposed to a room ambient. Although a native oxide free substrate is not easily achievable, by controlling the pre-clean condition and queue time (waiting time from pre-clean step to oxidation step), the thickness of native oxide could be controlled at an acceptably low level.

The partially processed integrated circuit 200 is subjected to an oxidation process. Typically, oxidation process is performed in a furnace where partially processed integrated circuit 200 is subjected to oxygen at a specific range of concentration level at a specific range of temperature conditions. After the oxidation process, a partially processed circuit 220 is formed. The partially processed circuit 220 includes a dielectric layer 222 overlying the substrate 221. Typically, the dielectric layer 222, which consists essentially of silicon oxide, is about 25 angstroms thick. It is often difficult to produce a dielectric layer 222 that is thinner than 25 angstroms. For example, at 25 angstroms, there are typically less than the size of a few molecules of silicon oxide within the thickness.

After dielectric layer 222 is formed, an additional nitridation process is performed. For example, the nitridation process includes subjecting the partially processed circuit 220 to $N_2O$ or NO in a furnace for a period of time. In another example, the nitridation process includes subjecting the partially processed circuit 220 to $NH_3$ in a furnace for a period of time. The nitridation process turns the partially processed circuit 220 into a partially processed circuit 240, resulting in an addition of nitrogen to the oxide to form a nitride-oxide dielectric layer 242 overlaying substrate 241. The addition of nitrogen into silicon oxide improves the electric properties of silicon oxide. For example, by addition of nitrogen to oxide, better breakdown characteristics are achieved.

While the structure 240 as shown is widely used for various applications, such structure is often unable to meet dimensional requirements required for small devices due to the thickness of the gate dielectric. It is often desirable for the gate dielectric layer to be 20 angstroms or less, a dimension that is typically unachievable by conventional techniques. Therefore, it is to be appreciated that various embodiments of the present invention provide a technique for forming thin gate dielectric layer.

Figure 3:
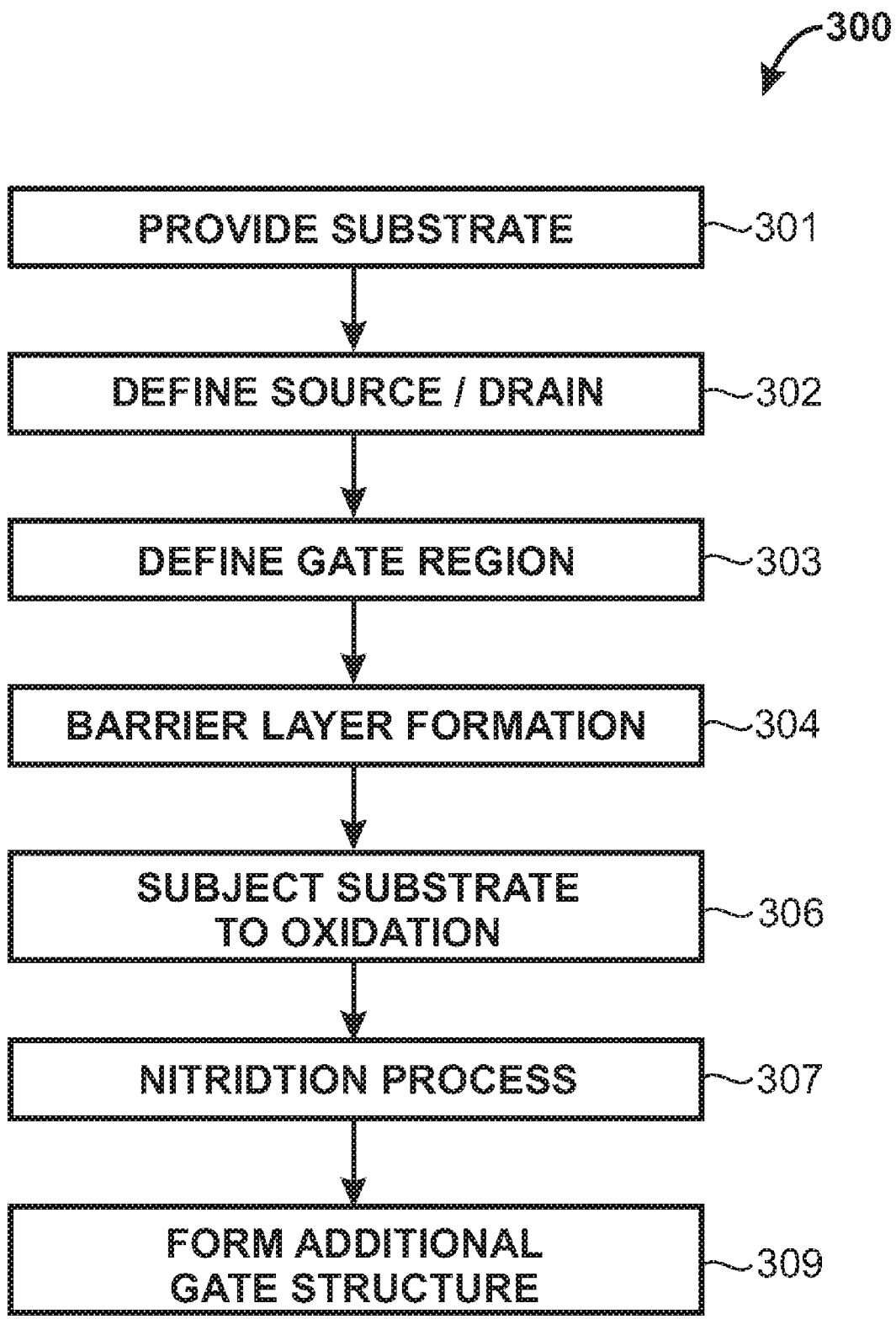
FIG. 3 is a flow diagram illustrating a technique for forming gate dielectric according to an embodiment of the present invention.

FIG. 3 is a flow diagram illustrating a technique for forming gate dielectric according to an embodiment of the present invention. This diagram is merely an example, which should not unduly limit the scope of the claims. One of ordinary skill in the art would recognize many variations, alternatives, and modifications. For example, various steps may be added, removed, replaced, rearranged, repeated, overlapped, and/or partially overlapped.

At step 301, a semiconductor substrate is provided. For example, the semiconductor substrate is partially processed. In various embodiments, the substrate is doped with impurities for forming MOS structures.

At step 302, a source region and a drain region within the semiconductor substrate are defined. The source region and the drain region are defined, according to certain embodiments, by doping impurities. For example, with the substrate being p type, both the source and the drain are doped with n+ type impurities. Typically, the source region and the drain region are symmetrical and exchangeable for various applications.

At step 303, a gate region within the semiconductor substrate is defined. For example, the gate region is positioned between the source region and the drain region.

At step 304, a first layer, or "an oxidation-deceleration layer" overlying the gate region is formed. For example, the first layer includes silicon nitride and/or silicon oxynitride. For example, the oxidation-deceleration layer is formed by a nitridation process, in which the semiconductor substrate is subjected to at least nitrogenous material for a first predetermined temperature range and a first period of time. According to various embodiments, the semiconductor is subjected to nitrogenous gas in a conventional furnace by an in-situ process. Depending upon application, temperature and time period may vary. In certain embodiments, the time is between one to sixty minutes at a temperature range of between 650 degrees to 1100 degrees Celsius. During the nitridation process, the semiconductor substrate may be subjected to a variety of gases containing nitrogen (for example, an $N_2O$ or NO gas, or in another example an $NH_3$ gas). For example, the nitrogenous gas is provided at 0.1 to 10 slm flow rate. In a specific embodiment, $N_2$ gas is provided as a dilution gas.

The first layer formed at step 304 serves a barrier layer for the subsequent oxidation process. In certain embodiments of the present invention, the native oxide, which has been controlled at an acceptably low level, is also converted to oxynitride by the nitridation process and becomes a part of the first layer. By controlling the pre-clean condition, the queue time, and the nitridation condition itself in step 304, a thin and uniform first layer within a thickness between 5 to 12 Angstroms could be achieved in one embodiment of the present invention.

Figure 4:
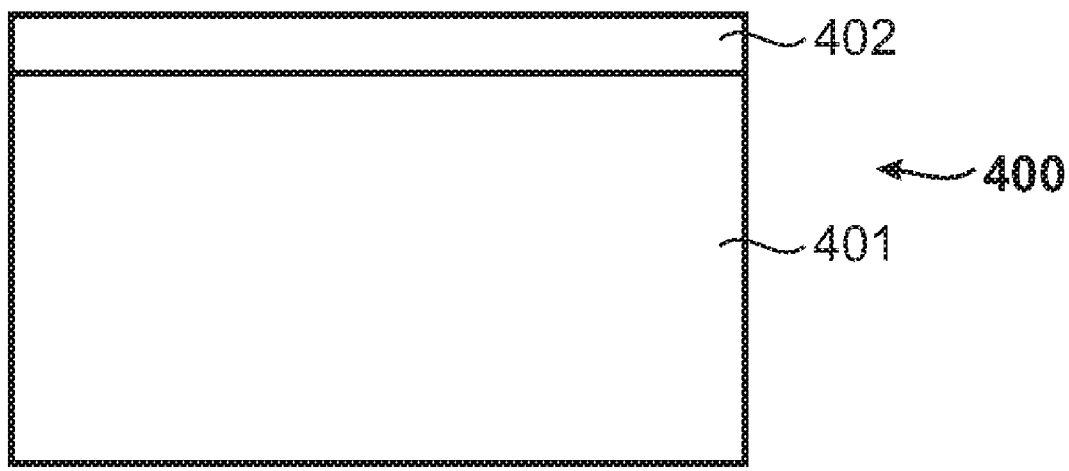
FIG. 4 is a simplified diagram illustrating a partially processed semiconductor substrate according to an embodiment of the present invention.

FIG. 4 is a simplified diagram illustrating a partially processed semiconductor substrate, which is formed after the step 304 is performed, according to an embodiment of the present invention. This diagram is merely an example, which should not unduly limit the scope of the claims. One of ordinary skill in the art would recognize many variations, alternatives, and modifications. A partially processed substrate 400 includes a semiconductor layer 401 and an oxidation-deceleration layer 402. For example, the semiconductor layer 401 consists essentially of silicon material. The oxidation-deceleration layer 402 is the first layer formed through the nitridation process in step 304, which consists essentially of silicon nitride and/or silicon oxynitride. Among other thing, the first layer 402 functions as a barrier layer when the substrate 400 is subjected to oxygen. The barrier layer serves as an oxidation deceleration media to allow better processing control in a subsequent oxidation process.

Now referring back to FIG. 3. At step 306, the semiconductor substrate is subjected to at least oxygen at a predetermined temperature range of between 700 and 1100 degrees Celsius for a second period of time between one to sixty minutes. According to a specific embodiment, the step 306 is performed in a furnace by an in-situ process. In this step, the presence of the oxidation-deceleration layer 402 helps to substantially decelerate diffusion of ambient oxygen atoms to form silicon oxide underneath layer 402. Hence the oxidation process becomes more controllable. Meanwhile, first layer 402 itself, with a thickness between 5 to 12 Angstroms, might may be partially or completely oxidized depends on process conditions according to certain embodiments of the invention.

Figure 5:
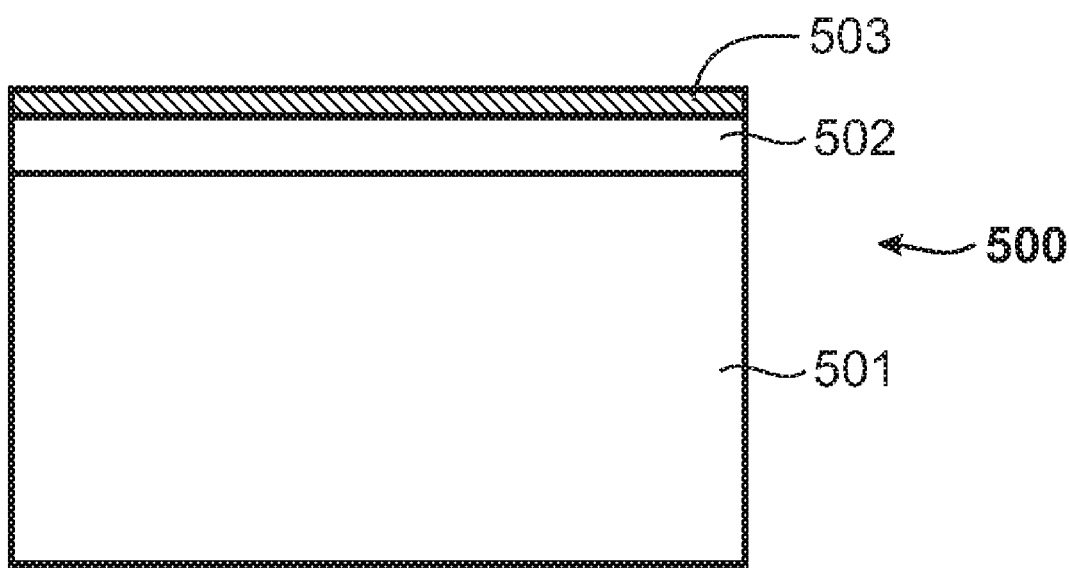
FIG. 5 is a simplified diagram illustrating a partially processed semiconductor substrate according to an embodiment of the present invention.

FIG. 5 is a simplified diagram illustrating a partially processed semiconductor substrate after the step 306 is performed on the previous substrate 400 according to an embodiment of the present invention. This diagram is merely an example, which should not unduly limit the scope of the claims. One of ordinary skill in the art would recognize many variations, alternatives, and modifications. A partially processed substrate 500 includes a semiconductor layer 501 and a second layer 502 overlaying semiconductor layer 501. Second layer 502 is formed at the step 306 by oxidizing the first layer 402 and partially oxidizing the semiconductor layer 401. In one embodiment, second layer 502 includes silicon oxide where the nitrogen atoms residing in the original first layer 402 are removed completely by the oxidation step 306. In another embodiment, the second layer 502 includes an oxide mixed with nitrogen where some of the nitrogen atoms in nitride and/or oxynitride of original first layer 402 remain after the oxidation step 306. As explained above, first layer 402 functions as a diffusion barrier for ambient oxygen atoms, the oxidation into the semiconductor layer 401 is limited. In one embodiment, the thickness of second layer 502 can be controlled at less than 20 Angstroms. Second layer 502 formed according to embodiments of the present invention is relatively thin and better controlled compared to conventional techniques. In another embodiment, the ultra thin thickness of second layer 502 as a gate dielectric layer provides superior electric performance of the integrate circuit.

Now referring back to FIG. 3. At step 307, a second nitridation process is performed. In various applications, the second nitridation process may be optional. For example, the second nitridation process results a third layer transformed from the second layer 502 by incorporating at least nitrogen atoms. The nitridation process is essentially the same as the nitridation process performed according to conventional techniques.

At step 309, a gate structure is formed. In one embodiment, a gate layer is formed overlaying the third layer formed at the step 307. In another embodiment, step 307 is omitted and the gate layer is formed overlaying the second layer formed at step 306. For example, various structures for providing contacts, such as polysilicon material or metal silicide material is used for forming a gate layer and for providing electrical connections. In various applications, other structures and/or contacts can be formed.

According to an embodiment, the present invention provides a method for manufacturing an integrated circuit. The method includes a step for providing a semiconductor substrate including silicon material. The method also includes a step for defining a source region, a drain region and a gate region within the semiconductor substrate. The gate region is positioned between the source region and the drain region. Additionally, the method includes a step for forming a first layer overlaying the gate region. The first layer includes silicon nitride and/or silicon oxynitride material. Furthermore, the method includes a step for oxidizing the semiconductor substrate overlaid with the first layer at a predetermined temperature range for a period of time to form a second layer overlaying the gate region. In one embodiment, the thickness of the second layer is less than 20 angstroms. The second layer includes at least silicon oxide material. The method further includes forming a gate layer overlying the second layer on the gate region. For example, the embodiment is illustrated according to FIGS. 3-5.

According to another embodiment, the present invention provides a method for manufacturing an integrated circuit. The method includes a step for providing a semiconductor substrate. The method also includes a step for defining a source region and a drain region within the semiconductor substrate. Furthermore, the method includes a step for defining a gate region within the semiconductor substrate. For example, the gate region is positioned between the source region and the drain region. The method also includes a step for subjecting the semiconductor substrate to at least nitrogenous gas for a first predetermined temperature range and a first period of time to form a first layer overlaying the gate region. For example, the first layer includes silicon nitride and/or silicon oxynitride material. In addition, the method includes a step for subjecting the semiconductor substrate to at least oxygen at a predetermined temperature range of between 700 and 1100 degrees Celsius for a second period of time between one to sixty minutes to form a second layer overlaying the gate region. For example, the second layer includes silicon oxide material that has a thickness less than 20 Angstroms. Furthermore, the method includes a step for forming a third layer by subjecting the semiconductor substrate to at least nitrogenous gas to incorporate nitrogen atoms into the second layer; and forming a gate layer overlaying the third layer. In one embodiment, the third layer is less than 20 Angstroms. For example, the embodiment is illustrated according to FIGS. 3-5.

Many benefits are achieved by way of the present invention over conventional techniques. For example, the present technique provides an easy to use process that relies upon conventional technology. Among other things, conventional furnace is utilized for gate oxide formation according to embodiments of the present invention. By using conventional furnace and other machineries, techniques according to the present invention is more controllable than certain conventional techniques. In some embodiments, the method provides an improved, more controllable technique for forming ultra thin dielectric layer for a gate structure in a MOSFET. For example, dielectric layers formed according to the present invention are typically thinner than dielectric layers formed according to conventional techniques. Additionally, the method provides a process that is compatible with conventional process technology without substantial modifications to conventional equipment and processes. Depending upon the embodiment, one or more of these benefits may be achieved.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing an integrated circuit comprising:
providing a semiconductor substrate including silicon material;
defining a source region and a drain region within the semiconductor substrate;
defining a gate region within the semiconductor substrate, the gate region being positioned between the source region and the drain region;
forming a first layer overlaying the gate region, the first layer including silicon nitride and/or silicon oxynitride material;
oxidizing the semiconductor substrate overlaid with the first layer at a predetermined temperature range for a period of time to form a second layer overlaying the gate region, the second layer being characterized by a thickness less than 20 angstroms, the second layer including at least silicon oxide material; and
forming a gate structure overlaying the second layer on the gate region,
wherein the first layer decelerates the oxidizing of the semiconductor substrate overlaid with the first layer.

2. The method of claim 1 wherein the oxidizing the semiconductor substrate overlaid with the first layer includes placing the semiconductor substrate in a furnace in a dry oxidation process.

3. The method of claim 1 wherein the oxidizing the semiconductor substrate overlaid with the first layer includes subjecting the semiconductor substrate to a water vapor in a wet oxidation process.

4. The method of claim 1 wherein the forming a first layer comprises subjecting the semiconductor substrate to a nitrogenous gas.

5. The method of claim 4 wherein the nitrogenous gas includes one of $N_2O$, or $NO$, or $NH_3$.

6. The method of claim 1 wherein the predetermined temperature range is between 700 to 1100 degrees Celsius.

7. The method of claim 1 wherein the period of time is between one to sixty minutes.

8. The method of claim 1 further comprising doping the semiconductor substrate with a p-type material.

9. The method of claim 1 further comprising doping the semiconductor substrate with a n-type material.

10. A method of forming controllable gate oxide for manufacture of an integrated circuit, the method comprising
providing a semiconductor substrate;
defining a source region and a drain region within the semiconductor substrate;
defining a gate region within the semiconductor substrate, the gate region being positioned between the source region and the drain region;
forming a first layer overlaying the gate region by subjecting the semiconductor substrate to at least nitrogenous gas for a first predetermined temperature range and a first period of time, the first layer including silicon nitride and/or oxynitride material;
forming a second layer within the gate region by subjecting the semiconductor substrate overlaid with the first layer to at least oxygen at a predetermined temperature range of between 700 and 1100 degrees Celsius for a second period of time between one to sixty minutes, the second layer including at least silicon oxide material overlaying the gate region with a thickness less than 20 Angstroms,
wherein the first layer decelerates the forming of the second layer by decelerating an amount of oxygen diffusing through the first layer.

11. The method of claim 10, and further comprising:
forming a third layer by subjecting the semiconductor substrate overlaid with the second layer to at least nitrogenous gas to incorporate nitrogen atoms into the second layer; and
forming a gate layer overlaying the third layer.

12. The method of claim 11 wherein the third layer has a thickness less than 20 Angstroms.

13. The method of claim 11 wherein the gate layer comprises polysilicon.

14. The method of claim 11 wherein the gate layer comprises metal silicide.

15. The method of claim 10 wherein the subjecting the semiconductor substrate to at least nitrogenous gas comprises subjecting the semiconductor substrate to one of NO gas, $N_2O$ gas, or $NH_3$ gas.

16. The method of claim 10 wherein the forming the second layer comprises subjecting the semiconductor substrate overlaid with the first layer to a water vapor.

17. The method of claim 10 wherein the first predetermined temperature is in a range between 650 degrees to 1100 degrees Celsius.

18. The method of claim 10 wherein the first period of time is in a range between one to sixty minutes.

* * * * *